United States Patent [19]

Kojima et al.

[11] Patent Number: 5,550,002
[45] Date of Patent: Aug. 27, 1996

[54] METHOD OF PRODUCING A PRINTING PLATE

[75] Inventors: Yasuo Kojima; Nobumasa Sasa; Takeo Akiyama, all of Hino, Japan

[73] Assignee: Konica Corporation, Japan

[21] Appl. No.: 415,326

[22] Filed: Apr. 3, 1995

[30] Foreign Application Priority Data

Apr. 7, 1994 [JP] Japan .................................. 6-069722

[51] Int. Cl.⁶ ...................................................... G03F 7/34
[52] U.S. Cl. ........................ 430/258; 430/260; 430/278.1
[58] Field of Search ................................... 430/278, 258, 430/260, 253, 254

[56] References Cited

U.S. PATENT DOCUMENTS

| | | | |
|---|---|---|---|
| 3,573,918 | 4/1971 | Chambers, Jr. et al. | 430/254 |
| 3,770,438 | 11/1973 | Celeste | 430/253 |
| 4,284,703 | 8/1981 | Inoue et al. | 430/254 X |
| 4,294,672 | 10/1981 | Ohba et al. | 204/129.4 |
| 4,427,500 | 1/1984 | Platzer | 430/278 |
| 4,502,925 | 3/1985 | Walls | 204/33 |
| 4,824,757 | 4/1989 | Aono et al. | 430/278 X |
| 5,061,591 | 10/1991 | Nakanishi et al. | 430/278 X |
| 5,076,899 | 12/1991 | Sakaki et al. | 430/278 X |

FOREIGN PATENT DOCUMENTS 3-242649  10/1991  Japan ...................................... 430/253

*Primary Examiner*—Cynthia Hamilton
*Attorney, Agent, or Firm*—Jordan B. Bierman; Bierman and Muserlian

[57] ABSTRACT

A method of producing a printing plate is disclosed, which comprises the steps of a) providing, on an aluminium support, a photo-hardenable light-sensitive layer on a 50 μm or less thick film to obtain a light-sensitive plate, the surface on the light-sensitive layer side of said support is electrolytically etched in a nitric acid solution to have an average surface roughness $R_a$ of 0.1 to 0.6 μm; b) imagewise exposing the photo-hardenable photosensitive layer of the light-sensitive plate; c) applying heat or pressure to the exposed light-sensitive plate; d) removing the exposed light-sensitive layer from the light-sensitive plate to leave an unexposed light-sensitive layer on the aluminium support; and e) overall exposing the unexposed light-sensitive layer to harden the same.

4 Claims, No Drawings

METHOD OF PRODUCING A PRINTING PLATE

FIELD OF THE INVENTION

The present invention relates to a method for producing a printing plate, and more particularly to a method of producing a printing plate in a dry process.

BACKGROUND OF THE INVENTION

There is a conventionally known method in which a relief image is transferred to be formed on a grained support to thereby prepare a printing plate. For example, Japanese Patent Publication Open to Public Inspection (hereinafter abbreviated to JP O.P.I.) No. 9501/1977 proposes a method in which a grained aluminum plate has thereon a light-sensitive layer and a cover sheet and, after being imagewise exposed, has the unexposed portions of the light-sensitive layer eliminated together with the cover sheet therefrom to thereby prepare a negative-type printing plate: and JP O.P.I. Nos. 184049/1991 and 172351/1992 propose a method in which a grained aluminum plate is laminated with an imagewise exposed light-sensitive layer and has the unexposed area alone of the layer transferred to thereby prepare a printing plate.

However, it was difficult to market the above printing plate-making method because nothing suitable as the grained support was available at all. The conventional mechanical graining emthod, which does not give uniform grain, makes it difficult to conduct uniform image transfer, so that the method is not suitable for the transfer-type image formation. The electrolytic etching method enables uniform graining, but the electrolytic etching in a hydrochloric acid bath or sulfuric acid bath forms crater-like grain, which prevents a resist material from extending over to the deepest part thereof at the time of the image transfer, resulting in a partial deterioration of the resist material's adhesion property and unsatisfactory printing durability. In a support anodized in the sulfuric acid bath, the adhesion of the transferred relief image to the grain was not sufficient, and no adequate printing durability was obtained.

SUMMARY OF TEE INVENTION

It is an object of the invention to provide a method of producing a printing plate which is capable of giving an improved image quality, and excellent in the suitability to printing as well as in the printing durability.

It is another object of the invention to provide a method of preparing a printing plate which has an improved printing durability and which is improved so as to be free of ground staind.

DETAILED DESCRIPTION OF THE INVENTION

The above objects of the invention are accomplished by the following constituents (1) to (9):

Item 1. A method of producing a printing plate comprising the steps of a) providing, on an aluminum support, a photohardenable light-sensitive layer on a 50 μm or less thick film to obtain a light-sensitive plate, the surface on the light-sensitive layer side of said support is electrolytically etched in a nitric acid solution to have an average surface roughness Ra of 0.1 to 0.6 μm; b) imagewise exposing the photohardenable photosensitive layer of the light-sensitive plate; c) applying heat or pressure to the exposed light-sensitive plate; d) removing the exposed light-sensitive layer from the light-sensitive plate to leave an unexposed light-sensitive layer on the aluminum support; and e) overall exposing the unexposed light-sensitive layer to harden the same.

Item 2. The method of producing a printing plate comprising the steps of a) imagewise exposing a light-sensitive material comprising a photohardenable light-sensitive layer on a 50 μm or less thick film; b) providing, on an aluminum support, the exposed light-sensitive material while applying heat or pressure, the surface on the light-sensitive layer side of said support is electrolytically etched in a nitric acid solution to have an average surface roughness Ra of 0.1 to 0.6 μm; c) removing the exposed light-sensitive layer from the exposed light-sensitive material to leave an unexposed light-sensitive layer on the aluminum support; and d) overall exposing the unexposed light-sensitive layer to harden the same.

Item 3. The method of producing a printing plate comprising the steps of a) imagewise exposing a light-sensitive material comprising a 50 μm or less thick film and provided thereon, a photohardenable light-sensitive layer and a cover sheet in this order: b) removing the cover sheet from the exposed light-sensitive material to leave an unexposed light-sensitive layer; c) providing, on an aluminum support, the unexposed light-sensitive layer while applying heat or pressure, the surface on the light-sensitive layer of said support is electrolytically etched in a nitric acid solution to have an average surface roughness Ra of 0.1 to 0.6 μm; and d) overall exposing the unexposed light-sensitive layer to harden the same.

Item 4. The method of Item 1, wherein the surface on the light-sensitive layer side of said support is mechanically grained, and then electrolytically etched in a nitric acid solution to have an average surface roughness Ra of 0.1 to 0.6 μm.

Item 5. The method of Item 2, wherein the surface on the light-sensitive layer side of said support is mechanically grained, and then electrolytically etched in a nitric acid solution to have an average surface roughness Ra of 0.1 to 0.6 μm.

Item 6. The method of Item 3, wherein the surface on the light-sensitive layer side of said support is mechanically grained, and then electrolytically etched in a nitric acid solution to have an average surface roughness Ra of 0.1 to 0.6 μm.

Item 7. The method of Item 1, wherein the surface on the light-sensitive layer side of said support is electrolytically etched in a nitric acid solution to have an average surface roughness Ra of 0.1 to 0.6 μm, and then anodized in a phosphoric acid solution to obtain an anodized film weight of 5 to 40 mg/dm$^2$.

Item 8. The method of Item 2, wherein the surface on the light-sensitive layer side of said support is electrolytically etched in a nitric acid solution to have an average surface roughness Ra of 0.1 to 0.6 μm, and then anodized in a phosphoric acid solution to obtain an anodized film weight of 5 to 40 mg/dm$^2$.

Item 9. The method of Item 3, wherein the surface on the light-sensitive layer side of said support is electrolytically etched in a nitric solution to have an average surface roughness Ra of 0.1 to 0.6 μm, and then anodized in a phosphoric acid solution to obtain an anodized film weight of S to 40 mg/dm$^2$.

DETAILED DESCRIPTION OF THE INVENTION

As the film used in the invention any material may be used as long as it is photographically inactive and dimensionally stable, typical examples of which include nitrocellulose film, triacetyl cellulose film, polyvinylacetal film, polystyrene film, polyethyleneterephthalate film, polycarbonate film, and poly-α-olefin film such as of polyethylene and polypropylene, and other resin films. The preferred among them is polyester film. A thin metal support or a complex support such as a metal-laminated plastic sheet or a metal-laminated paper support may also be used. Among these supports, an aluminum plate or an aluminum-laminated plastic support is preferred because of its stable dimensional stability and light weight. The above support preferably has its surface subjected to an appropriate subbing treatment for light-sensitive layer coatability or adhesion property improvement. Further, the support may have on the obverse or reverse thereof a dye or pigment-containing antihalation layer for the antihalation purpose. The surfaces on the light-sensitive resin layer-forming side and on the backing side of the support are preferably as matted as to have a surface roughness Ra of 1.0 to 3.0 μm.

The thickness of the film needs to be not more than 50 μm, and preferably 4 to 20 μm. If the thickness is less than 4 μm, the dimensional stability of the support become poor. If the thickness exceeds 20 μm, the touchableness of the thin sheet with the support lowers to make it unable to obtain a good transfer image.

Compositions to form the photohardenable light-sensitive resin layer used in the invention include photohardenable compositions, photo-crosslinkable compositions and diazo compounds. The preferably usable among these compositions are photopolymerizable compositions and photo-crosslinkable compositions.

Useful photopolymerizable compositions are as follows: As the binder component there may be used thermoplastic polymers having an excellent compatibility with photopolymerizable components; for example, polyvinyl chloride, chlorinated polyolefin, poly(meth)acrylate, epoxy resin, polyurethane resin, cellulose derivatives, polyamide resin, polyvinylbutyral resin, polyvinylacetal resin, polyvinylpyrrolidone, gelatin, diallyl phthalate resin, butadiene-acrylonitrile copolymer, polyvinyl acetate, vinyl versatate, and the like.

As the photopolymerizable component there may be used ethylenically unsaturated compounds, typical examples of which includ 2-hydroxyethyl (meth)acrylate, ethylene glycol diacrylate, diethylene glycol diacrylate, 1,6-hexanediol di(meth)acrylate, trimethylolpropane triacrylate, pentaerythritol triacrylate, dipentaerythritol triacrylate, dipentaerythritol hexacrylate, and the like. These ethylenically unsaturated compounds may be used alone or in combination of two or more kinds thereof.

The above photopolymerizable component is used preferably in an amount of 10 to 500 parts by weight, more preferably 30 to 200 parts by weight per hundred parts by weight of the binder component.

Useful materials as the photopolymerization initiator include such carbonyl compounds as described in J. Koser, the 'Light-Sensitive Systems,' Chapter 5; organic sulfur compounds, persulfide compounds, peroxidized compounds, redoxy compounds, azo and diazo compounds, halogenated compounds, photoreductive dyes, and the like. Further, concrete compounds as the photopolymerization initiater are exemplified in British Patent No. 1,459,563.

Compounds usable as the photosensitizer in the invention include benzoin derivatives such as benzoin-methyl ether, benzoin-isopropyl ether and α,α-dimethoy-α-phenylacetophenone; benzophenone derivatives such as benzophenone, 2,4-dichlorobenzophenone, o-benzoyl-methyl-benzoate, 4,4-bis(dimethylamino)benzophenone and 4,4-bis(diethylamino)benzophenone; thioxanthone derivatives such as 2-chlorothioxanthone and 2-isopropylthioxanthone; anthraquinone derivatives such as 2-chloroanthraquinone and 2-methylanthraquinone; acridone derivatives such as N-methylacridone and N-butylacridone; α,α-diethoxyacetophenone; fluorenone; xanthrone; uranyl compounds; and halogenated compounds.

As the photosensitizer the use of compounds having absorptions in the spectral region of visible rays, such as the following pyropyrrole compounds, quinacridone compounds, azo compounds and coumarin compounds, enables the obtaining of photopolymerizable compositions highly sensitive to a low-output visible laser light.

The above-mentioned sensitizers are preferably pyropyrrole compounds represented by the following Formula 1, quinacridone compounds represented by the following Formula 2, azo compounds represented by the following Formula 3 or 4, and coumarin compounds represented by the following Formula 5.

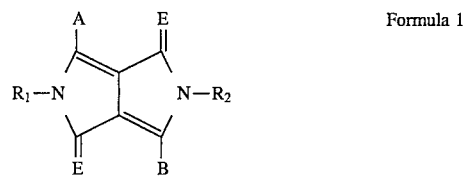

Formula 1 wherein A and B each represent an alkyl group, an aralkyl group, a cycloalkyl group or a carbocyclic or heterocyclic aromatic grpi; $R_1$ and $R_2$ each represent a hydrogen atom or a substituent not making the compound water-soluble; and E represents a sulfur atom or an oxygen atom.

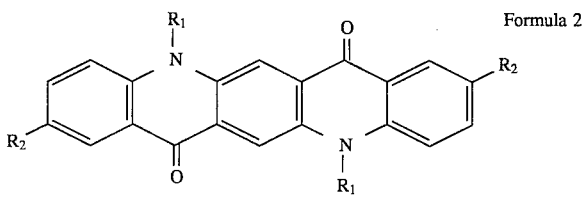

Formula 2 wherein $R_1$ represents an alkyl group; and $R_2$ represents an alkyl group or a perhalogenated alkyl group.

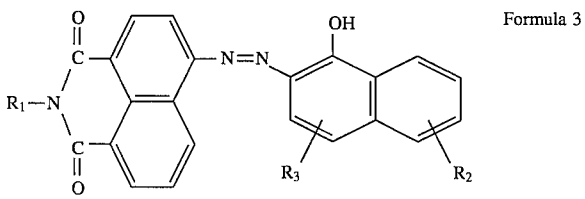

Formula 3

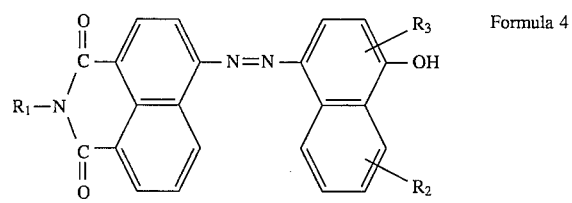

Formula 4

In Formulas 3 and 4. $R_1$ represents an alkyl group; and $R_2$ and $R_3$ each represent a hydrogen atom, a halogen atom, an alkyl group, an alkoxy group, a cyano group, a carboxyl group, a hydroxyl group, an acyloxy group, an alkylmercapto group or an alkoxycarbonyl group.

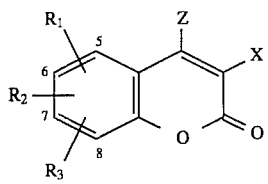

Formula 5 wherein $R_1$, $R_2$ and $R_3$ each represent a hydrogen atom, a chlorine atom, a lower alkyl group, a lower dialkylamino group, a lower dialkenylamino or alicyclic amino group, or a heterocyclic group whose total number of carbon atoms and hetero atoms is 5 to 9; and Z is a hydrogen atom or a cyano group.

Further, the incorporation of a cationic dye's borate complex having absorptions in a near-infrared spectral region into the photopolymerization initiator enables the obtaining of a photopolymerizable composition highly sensitive to a near-infrared solid laser light, etc. The preferred as the dye's borate anion formed from the cationic dye moiety and borate anion are those represented by the following Formula 6:

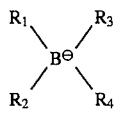

Formula 6 wherein $R_1$, $R_2$, $R_3$ and $R_4$ each represent an alkyl group such as ethyl or butyl, an aryl group such as phenyl or naphthyl, an aralkyl group such as benzyl or phenethyl, an alkenyl group such as vinyl or allyl, an alkynyl group such as propynyl, a cycloalkyl group such as cyclopentyl or cyclohexyl, or a heterocyclic group such as thienyl or pyridyl; these groups each may further have a subsequent. The most preferred case is where at least one of the $R_1$ to $R_4$ is an aryl group and at least another is an alkyl group.

The aryl group is preferably a phenyl or naphthyl group, which may be substituted by an alkyl or alkoxy group. The alkyl group is preferably an alkyl group having 1 to 12 carbon atoms, such as methyl, ethyl, propyl, butyl, pentyl, hexyl, octyl or decyl. These alkyl groups may be substituted by a halogen atom, an alkoxy group, a hydroxyl group, a cyano group, a phenyl group, or the like. Examples of the cationic dye moiety include cationic ones having absorptions in the near-infrared region, such as cyanine, merocyanine, carbocyanine, rhodamine, azomethine, indoaniline, azulenium, polymethine, triarylmethine, indoline, thiazine, xanthene, acridine and oxazine dyes.

The preferred as the cationic dye are cyanine dyes, azulenium dyes and indoaniline dyes. These dyes are described in, e.g., Shikizai 61(4) pp. 215–216. Typical examples of such dyes are listed below:

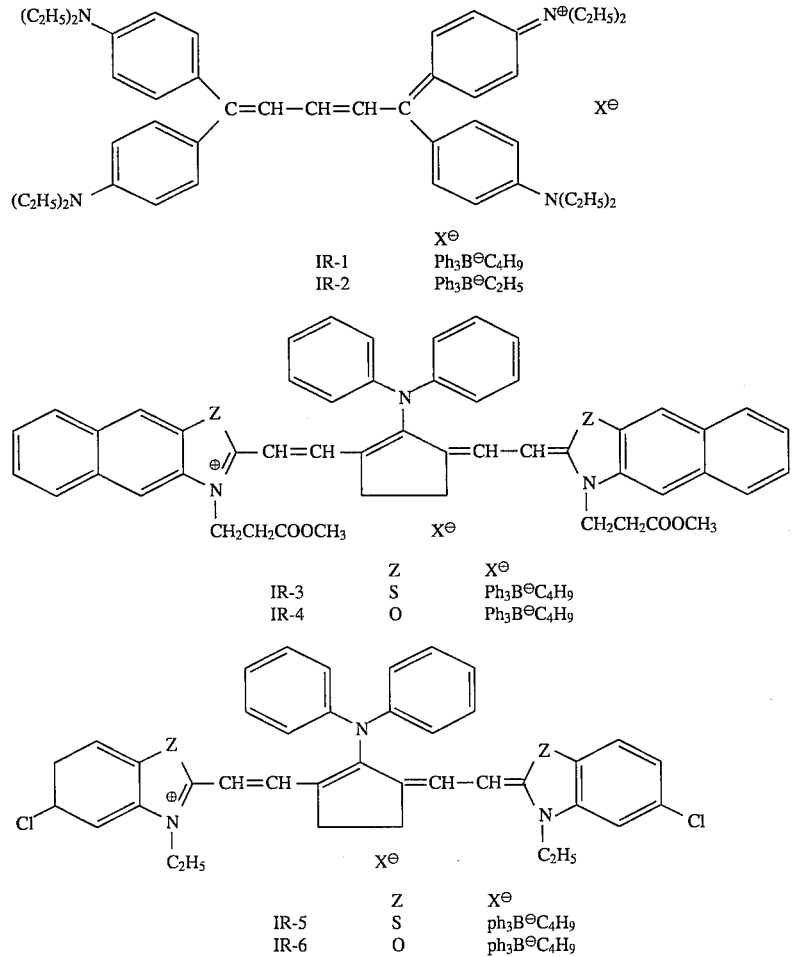

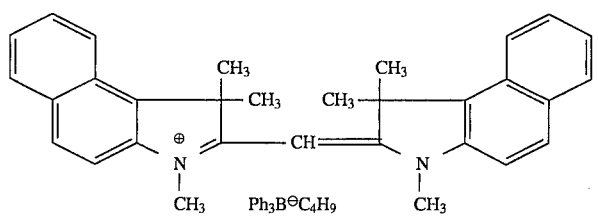
IR-7
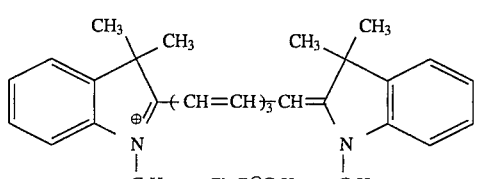
IR-8
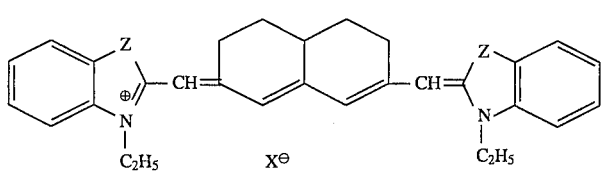
| | Z | X⊖ |
|---|---|---|
| IR-9 | S | (CH₃OPh)₃B⊖C₄H₉ |
| IR-10 | O | Ph₃B⊖C₄H₉ |
| IR-11 | S | (C₄H₉)₃B⊖Ph |
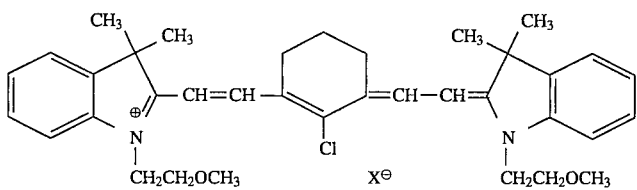
| | X⊖ |
|---|---|
| IR-12 | Ph₃B⊖C₄H₉ |
| IR-13 | (CH₃OPh)₃B⊖C₄H₉ |
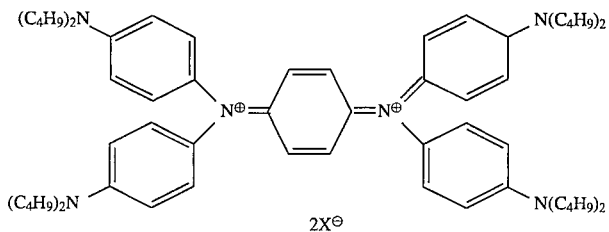
| | X⊖ |
|---|---|
| IR-14 | Ph₃B⊖C₄H₉ |
| IR-15 | Ph₃B⊖C₆H₁₃ |

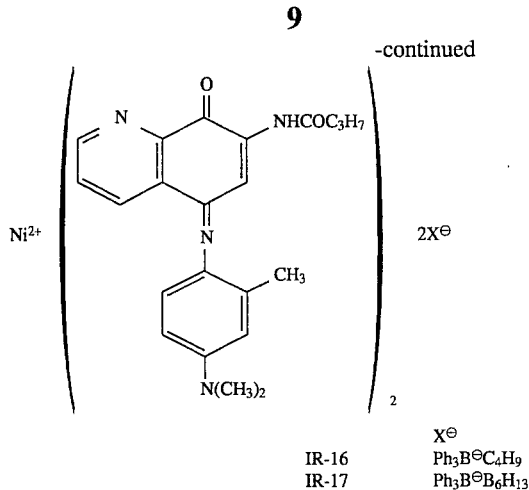

|   | X⁻ |
|---|---|
| IR-16 | $Ph_3B^\ominus C_4H_9$ |
| IR-17 | $Ph_3B^\ominus B_6H_{13}$ |

With the photopolymerizable composition there may, if necessary, be used in combination a sensitization assistant, e.g., an amine compound such as Michler's ketone or 4,4'-bisdiethylaminobenzophenone.

The thickness of the light-sensitive layer, although not restricted, may be approximately 0.5 μm. The precise coating weight of the light-sensitive layer depends on the colorant (dye or pigment) used, but is preferably 0.5 to 30 g/m². The coating may be carried out by use of a bar coater, spin coater or other equivalent coater.

A useful photo-crosslinkable compound for the photo-crosslinkable composition of the invention is a polyester comprised of the dicarboxylic acid unit represented by the following Formula 7 and the glycol unit represented by the following Formula 9.

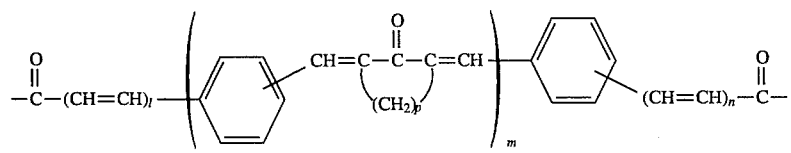

Formula 7 wherein m represents an integer of 0 or 1, provided when m is 0, 1 and n each represent 0 or 1, and at least either one of 1 and n is 1, while when m is 1, 1 and n each is 0; and p represents 2 or 3.

Formula 8 wherein R represents an alkylene group having 2 to 4 carbon atoms; and r is an integer of 2, 3 or 4.

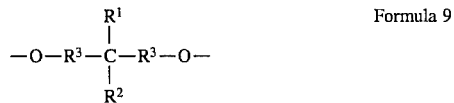

Formula 9 wherein $R^1$ and $R^2$ each represent a hydrogen atom or an alkyl group having 1 to 6 carbon atoms; and $R^3$ represents a hydrogenated benzene ring.

Examples of the dicarboxylic acid unit represented by Formula 7 include those derived from preferably phenylenediacrylic acid, p-carboxy-cinnamic acid, bis(p-carboxybenzal)cyclohexanone, bis(p-carboxybenzal)cyclopentanone, etc. The most preferred among them is a unit derived from phenylenediacrylic acid.

Examples of the glycol unit represented by Formula 8 include those derived from diethylene glycol, triethylene glycol, tetraethylene glycol, dipropylene glycol, tripropylene glycol, and the like.

Examples of the glycol unit represented by Formula 9 include those derived from hydrogenated bisphenol F and hydrogenated bisphenol A. The hydrogenation degree had better be high; those having Formula 9 wherein $R^3$ is a cyclohexane ring are especially preferred.

The rate of the glycol unit of Formula 8 accounting for of the whole glycol unit is preferably 10 to 90 mol %, more preferably 30 to 70 mol %. If the rate exceeds the above range, the composition's resistance to chemicals weakens, while if it is smaller than the lower limit of the range, the composition's sensitivity falls.

The average molecular weight of the light-sensitive polyester, although not restricted, is preferably 5,000 to 50,000, more preferably 9,000 to 20,000. The term 'average molecular weight' herein means a weight average molecular weight.

The above light-sensitive polyester can be easily prepared according to a well-known method, such as the method described in U.S. Pat. No. 3,622,320. Namely, a dicarboxylic acid ester that forms a dicarboxylic acid unit represented by Formula 7 and a glycol mixture that forms the glycol units represented by Formulas 8 and 9 are dissolved by heating, and titanium and germanium catalysts are added thereto to carry out ester exchange, and then the reaction system, under gradually reduced pressure, is heated to raise its temperature to have its excessive glycol distilled, whereby an objective product can be obtained. The reaction period of time is normally about 4 hours, the temperature in the final stage of the polymerization is 230° to 240° C., and the reduced pressure is approximately 3 mmHg.

The photo-crosslinkable composition is usually prepared by dissolving the foregoing light-sensitive polymer in a solvent. Suitable examples of the solvent, although dependent upon the molecular weight and composition of the polymer used, include chlorine solvents such as methylene chloride, chloroform, trichloroethane, trichloroethylene, chlorobenzene, dichlorobenzene, and carbon tetrachloride; alcohol solvents such as furfuryl alcohol, tetrahydrofurfuryl alcohol and benzyl alcohol; ether solvents such as dioxane and tetrahydrofuran; ethylene glycol-monoalkyl ethers and diethylene glycol-monoalkyl ethers such as ethylene glycol-monomethyl ether, ethylene glycol-monoethyl ether, ethylene glycol-monopropyl ether, ethylene glycol-monobutyl ether, diethylene glycol-monomethyl ether, diethylene glycol-monoethyl ether, diethylene glycol-monopropyl ether and diethylene glycol-monobutyl ether, ether, solvents such as ethylene glycol-ethyl ether acetate, diethylene glycol-ethyl ether acetate and ethyl acetate, nitrogen-containing compounds such as dimethylformamide, methylpyrrolidone, nitroethane and nitrobenzene; ketone solvents such as methyl-ethyl ketone, methyl-isobutyl ketone, cyclohexanone, methylcyclohexanone and 4-methyl-4-methoxy-2-pentanone; and dimethylsulfoxide. The solvent to be used in the invention is arbitrarily selected from among these compounds.

The photo-crosslinkable composition may, if necessary, contain various components in addition to the above components. For example, it may contain a sensitizer or phthalocyanine, a pigment such as zinc oxide, and dyes such as Victoria Pure Blue BOH, ethyl violet, and the like.

As the sensitizer any compounds applicable to this field may be used which include aromatic carbonyl compounds such as benzophenone derivatives, benzanthrone derivatives, naphthothiazoline derivatives, quinones, etc.; and aromatic nitro compounds.

The benzophenone derivatives include Michler's ketone, diethylaminoethylbenzophenone, etc.; the benzanthrone derivatives include benzanthrone, 6,11-dichlorobenzanthrone, 11-chloro-6-hydroxybenzanthrone, 1-carboethoxy-2-keto-3-methyl-3-aza-1,9-benzanthrone, etc.; the quinones include 1,8-dimethoxyanthraquinone, 1,8-dichloroanthraquinone, 1,2-benzanthraquinone, etc.; the aromatic nitro compounds include mono- and polynitro compounds such as 5-nitroacenaphthene, 2-nitrofluorene, 2,7-dinitrofluorene, 1-nitronaphthalene, 1,5-dinitronaphthalene, etc.; the naphthothiazoline derivatives include 2-dibenzoylmethylene-3-methylnaphthothiazoline, 2-benzoylmethylene-3-methylnaphthothiazoline, and the like.

The photo-crosslinkable composition is coated on the thin sheet in the usual manner by using a well-known coating method such as a dip coat, coating rod, spinner coat or spray coat process, whereby a laminate can be prepared.

The light-sensitive layer of the invention may contain the colorant described in JP O.P.I. No. 172351/1992 in addition to the above-mentioned materials.

The thickness of the light-sensitive layer of the invention is 0.1 to 10 μm, and preferably 0.5 to 5 μm.

In Items 1 through 9 of the invention, a thermosoftening layer may, if necessary, be provided between the thin sheet and the light-sensitive resin layer for the purpose of improving the transferability of the relief image onto the aluminum support. The thermosoftening layer is comprised of a thermoplastic resin, which has the property of being softened by heating. As the thermosoftening layer there may be used the thermosoftening layer described in JP O.P.I. No. 172351/1992. The thermosoftening layer is preferably comprised of a polyolefin compound, and more preferably a resin having a softening point of 30° C. to 150° C.

The cover sheet according to Items 3, 6 and 9 of the invention, where exposure is made from the cover sheet side, needs to have a good light-transmittance and a uniform surface. Regarding the light transmittance, the cover sheet needs to have a transmittance of not less than 50%, preferably not less than 65% in the spectral range of near ultraviolet and visible rays (wavelength range of about 290 nm–650 nm).

Concrete compounds usable as the cover sheet are polyethylene terephthalate, polypropylene, polyethylene, cellulose triacetate, cellulose diacetate, polyvinyl chloride, polyvinyl alcohol, polycarbonate, polystyrene, cellophane, polyvinylidene chloride copolymers, polyamide, polyimide, vinyl chloride-vinyl acetate copolymer, polytetrafluoroethylene, polytrifluoroethylene, and the like. Any complex material composed of two or more kinds of these compounds may also be used.

The cover film may have a thickness of preferably 5 to 100 μm, and more preferably 10 to 40 μm.

The aluminum support used in Items 1 to 3 of the invention is explained. As the substrate of the aluminum support there may be used a pure aluminum plate, an aluminum alloy plate, or other metal plate with its surface covered with aluminum or aluminum alloy. Film or paper may also be used.

The surface of the aluminum support is grained by electrolytic etching, which is carried out by use of an electrolytic bath filled with nitric acid or a nitric acid-containing acid mixture. Prior to the electrolytic etching, the aluminum support may be subjected to a mechanical graining treatment such as ball graining, brush graining, liquid honing or buff graining. The aluminum support is surface-grained so as to have a surface roughness Ra of 0.1 to 0.6 μm.

For the electrolytic etching, the aluminum support is immersed in a bath containing nitric acid in an amount of preferably 0.1 to 0.5 mol/liter, more preferably 0.2 to 0.4 mol/liter to be subjected to electrolytic etching for 10 seconds to 3 minutes at a temperature of preferably 20° to 50° C., more preferably 25° to 45° C. under the condition of a current density of 20 to 200 A/dm$^2$.

The aluminum support that has been subjected to electrolytic etching is preferably chemically cleand because it is necessary to remove the residual, so called 'smut', from its surface. The above treatments include the alkali etching method described in Japanese Patent Examined Publication (hereinafter abbreviated to JP E.P.) No. 28123/1973 and the sulfuric acid desmut method described in JP O.P.I. No. 12739/1978.

After the electrolytic etching treatment, the aluminum support is preferably subjected to anodizing treatment to form an anodized coat thereon.

The anodizing treatment can be carried out by electrolyzing the aluminum support with itself used as an anode for 10 seconds to 2 minutes under the condition of a current density of 1 to 10 A/dm$^2$ in an electrolytic bath filled with an eletrolyte, i.e., an aqueous solution of one or two or more of sulfuric acid, chromic acid, oxalic acid, phosphoric acid, malonic acid, etc., in a total concentration of 10 to 50%. There is another anodizing method as described in U.S. Pat. No. 1,412,768, in which the electrolysis is made in sulfuric acid at a high current density. The anodized coat amount is preferably 1 to 50 mg/dm$^2$, and more preferably 5 to 30 mg/dm$^2$.

In the electrolytic bath, the use of phosphoric acid is preferred because it improves the aluminum support's adhesion to the transferred image.

The anodized aluminum support may be further subjected to a treatment of immersing it in an aqueous solution of an alkali metal silicate such as sodium silicate as described in U.S. Pat. Nos. 2,714,066 and 3,181,461; may have thereon a subbing layer comprising a hydrophilic cellulose (such as carboxymethyl cellulose) containing a water-soluble metal salt (such as zinc acetate) as described in U.S. Pat. No. 3,860,426; and may be subjected to polyvinylsulfonic acid treatment as described in U.S. Pat. No. 4,153,461.

The aluminum support according to Items 4 to 6 of the invention is explained. As the substrate of the aluminum support there may be used a pure aluminum plate, an alluminum alloy plate, or other metal plate with its surface covered with aluminum or aluminum alloy. Film or paper may also be used. The surface of the aluminum support is subjected to mechanical graining, which is following by electrolytic etching treatment.

The above mechanical graining method includes a sand blast method, a ball graining method, a wire graining method, a brush graining method that uses a nylon brush and abrasive/water slurry, and a honing method that makes a high-pressure blow of abrasive/water slurry against the surface.

The electrolytic etching is conducted in an electrolytic bath containing hydrochloric acid, sulfuric acid, nitric acid or a mixture of these acids. It is preferable to subject the aluminum support to electrolytic etching by immersing it in an aqueous solution of an acid in a concentration of preferably 0.1 to 0.5 mol/liter, more preferably 0.2 to 0.4 mol/liter for 10 secpmds to 3 minutes at a temperature of preferably 20° to 50° C., more preferably 25° to 45° C. under the condition of a current density of 20 to 200 A/dm$^2$.

Regarding the surface roughness of the obtained aluminum support, its maximum value Rmax is not more than 5 μm, and the peak count of the surface roughness is preferably substantially zero from the image reproduction point of view.

The aluminum support that has been subjected to electrolytic etching is preferably chemically cleaned because it is necessary to remove the residual, so-called 'smut,' from its surface. The above treatments include the alkali etching method described in JP E.P. No. 2813/1973 and the sulfuric acid desmut method described in JP O.P.I. No. 12739/1987.

After the electrolytic etching treatment, the aluminum support is preferably subjected to anodizing treatment to thereby form an anodized coat thereon. The anodizing treatment can be carried out by electrolyzing the aluminum support with itself used as an anode for 10 seconds to 2 minutes under the condition of a current density of 1 to 10 A/dm$^2$ in an electrolytic bath filled with an electrolyte, i.e., an aqueous solution of one or two or more of sulfuric acid, chromic acid, oxalic acid, phosphoric acid, malonic acid, etc., in a total concentration of 10 to 50%. There is another anodizing method as described in U.S. Pat. No. 1,412,768, in which the electrolysis is made in sulfuric acid at a high current density. The anodized coat amount is preferably 1 to 50 mg/dm$^2$, and more preferably 5 to 30 mg/dm$^2$. In the electrolytic bath, the use of phosphoric acid is preferred because it improves the aluminum support's adhesion to the transferred image.

The anodized aluminum support may be further subjected to a treatment of immersing it in an aqueous solution of an alkali metal silicate such as sodium silicate as described in U.S. Pat. Nos. 2,714,066 and 3,181,461; may have thereon a subbing layer comprising a hydrophilic cellulose (such as carboxymethyl cellulose) containing a water-soluble metal salt (such as zinc acetate) as described in U.S. Pat. No. 3,860,426; and may be subjected to polyvinylsufuric acid treatment as described in U.S. Pat. No. 4,153,461.

The aluminum support according to Items 7 to 9 of the invention is explained. As the substrate of the aluminum support there may be used a pure aluminum plate, an aluminum alloy plate, or other metal plate with its surface covered with aluminum or aluminum alloy. Film or paper may also be used. The surface of the aluminum support is grained by a mechanical graining method such as a brush graining or ball graining method or an electromechanical method such as an electrolytic etching method or a combination of both methods.

The electrolytic etching is conducted in an electrolytic bath containing nitric acid, hydrochloric acid, sulfuric acid, or a mixture of these acids. It is preferable to subject the aluminum support to electrolytic etching by immersing it in an electrolytic bath containing an aqueous solution of nitric acid in a concentration of preferably 0.1 to 0.5 mol/liter, more preferably 0.2 to 0.4 mol/liter for 10 seconds to 3 minutes at a temperature of preferably 20° to 50° C., more preferably 25 to 45° C. under the condition of a current density of 20 to 200 A/dm$^2$.

Prior to the electrolytic etching, it is preferable to subject the aluminum support to mechanical graining treatment such as ball graining, brush graining, liquid honing or buff graining treatment.

The aluminum support that has been subjected to electrolytic etching is preferably chemically cleand because it is necessary to remove the residual, so-called 'smut,' from its surface. The above treatments include the alkali etching method described in JP E.P. No. 28123/1973 and the sulfuric acid desmut method described in JP O.P.I. No. 12799/1978.

After the electrolytic etching treatment, the aluminum support is preferably subjected to anodizing treatment to thereby form an anodized coat thereon. The anodizing treatment can be carried out by electrolyzing the aluminum support with itself used as an anode for 10 seconds to 2 minutes under the condition of a current density of 1 to 10 A/dm$^2$ in an electrolytic bath containing phosphoric acid in a concentration of 10 to 50% as an electrolyte. The formed anodized coat amount is preferably 5 to 40 mg/dm$^2$, and more preferably 10 to 30 mg/dm$^2$.

The anodized aluminum support may be further subjected to a treatment of immersing it in an aqueous solution of an alkali metal silicate such as sodium silicate as described in U.S. Pat. Nos. 2,714,066 and 3,181,461; may have thereon a subbing layer comprising a hydrophilic cellulose (such as carboxymethyl cellulose) containing a water-soluble metal salt (such as zinc acetate) as described in U.S. Pat. No. 3,860,426; and may be subjected to polyvinylsulfonic acid treatment as described in U.S. Pat. No. 4,153,461.

According to the preferred embodiment of Items 7 to 9 of the invention, the aluminum support has a surface roughness Rmax of 1 to 5 μm and Ra of 0.1 to 0.6 μm, in which the peak count value that exceeds a limit which is provided 2 μm above the center line and is in parallel with the center line is substantially zero, wherein the surface maximum roughness Rmax and the average surface roughness Ra are values obtained by measuring with a probe-type surface roughness tester and determined in accordance with German Standard DIN3768, and the peak count, stipulated by the same German Standard, is, in the surface roughness profile R, the number of peaks that exceed a line provided above and in parallel with the center line.

In the invention, that the above 'peak count is substantially zero' implies that the average value of the peak count numbers measured according to the aforementioned measuring method at 10 or more pints selected at random on the surface of the support is not more than 0.49/nm.

The above surface graining of the aluminum support results in the improvement of the image resolution as well as of the image transferrability.

Next, the method of producing the printing plate of the invention is explained. In the invention, 'to laminate' means 'to place one layer upon another to bring them into close contact with each other.'

The invention of Item 1 is of a printing plate producing method which is such that a photohardenable light-sensitive resin layer-having thin sheet with its light-sensitive layer side laminated to an aluminum support is imagewise exposed; both the thin sheet and the exposed portion of the light-sensitive resin layer are removed from the aluminum support after completion of or simultaneously with heating and/or pressing the laminated unit; and the unexposed portion of the light-sensitive resin layer remaining on the support is subjected to after-exposure treatment to thus harden the same to thereby prepare a printing plate. Regarding the imagewise exposure, the light source used for this purpose is not particularly restricted as long as it can cause the light-sensitive composition to effect hardening reaction. Contact printing exposure may be made through a light-permeable original image. Alternatively, a modulable light source like a laser light may be used to make line-to-line or point-to-point sequential scanning exposure.

After the imagewise exposure, the laminated unit is subjected to heating and/or pressure treatment in order to have the unexposed portion of the light-sensitive resin layer transferred onto the aluminum support, but the heating is preferably made at a temperature of not lower than 80° C. under pressure of not less than 1 kg/m². Peeling the thin sheet apart from the support is performed simultaneously with or after the heating and/or pressure treatment. More preferably the peeling is carried out in parallel with the heating/pressure treatment. To be concrete, while letting the laminated unit pass between the juxtaposed heated rollers having pressure, the thin sheet and the support are peeled apart on the outlet side of the rollers. At this moment, the exposed portion of the light-sensitive resin layer is removed together with the thin sheet from the support, while the unexposed of the same light-sensitive layer is transferred onto the aluminum support. The unhardened light-sensitive resin transferred onto the support is then again exposed to an active light to be hardened, whereby a printing plate is obtained.

The invention of Item 2 is of a printing plate producing method which is such that prior to laminating the aluminum support with the light-sensitive resin layer of the thin sheet, an imagewie exposure is given to the thin sheet unit from the thin sheet side or from the cover sheet side thereof, and thereafter the unexposed portion of the light-sensitive resin layer is transferred onto the aluminum support. The conditions of the imagewise exposure, transfer and after-exposure may be the same as in claim 1.

The invention of Item 3 is of a printing plate producing method which is such that prior to laminating the aluminum support with the light-sensitive resin layer, an imagewise exposure is given to the thin sheet unit composed of a thin sheet, a photohardenable light-sensitive resin layer and a cover sheet from the thin sheet side or cover sheet side thereof, the cover sheet is removed to make a peel development to thereby form a relief image on the thin sheet, and the relief image is transferred onto the aluminum support. The conditions of the imagewise exposure, transfer and after-exposure may be the same as in claim 1.

The invention of Item 4 is of a method in which a printing plate is produced in the same manner as in Item 1 except that the aluminum support's graining method is different from that of Item 1. Item 5 is of a method in which a printing plate is produced in the same manner as in Item 4 except that the imagewise exposure is conducted prior to laminating the aluminum support with the light-sensitive resin layer. Item 6 is of a method in which a printing plate is prepared in the same manner as in Item 3 except that the aluminum support's graining method is different from that of Item 3. Item 7 is of a method in which a printing plate is prepared in the same manner as in Item 1 except that the aluminum support's graining method is different from that of Item 1. Item 8 is of a method in which a printing plate is produced in the same manner as in Item 2 except that the aluminum support's graining method is different from that of Item 2. And Item 9 is of a method in which a printing plate is produced in the same manner as in Item 3 except that the aluminum support's graining method is different from that of Item 3.

EXAMPLES

The invention is illustrated in detail by the following examples. The term 'part' used in the following examples means part(s) by weight.

Example 1 (Item 1)

On a subbed polyethylene terephthalate film of 10 μm in thickness was coated the following light-sensitive composition so as to have a dry thickness of 2 μm.

Superclon CPE907LTA (chlorinated polyolefin, produced by Sanyo Kokusaku Pulp) 50 parts
TMPTA (trimethylolpropane triacrylate, produced by Shin-Nakamura Kagaku K.K.) 100 parts
Ethyl-p-aminobenzoate 3 parts
DETX (diethylthioxanthone, produced by Ciba Geigy) 3 parts
Carnauba wax 33 parts
Methylethyl ketone 1000 parts An aluminum support with its surface subjected to nitric acid/electrolytic etching treatment was laminated with the above composition under pressure of 1 kg/cm². Subsequently, a transparent positive original image was brought into close contact with the polyethylene terephthalate film side of the aluminum support, and it was exposed through the original to a ultraviolet light. The aluminum plate was let pass between juxtaposed pressure rollers heated to 80° C. and having a pressure of 3 kg/cm². The ethylene terephthalate film was peeled off together with the exposed portion from the aluminum plate, and the unexposed portion remained on the aluminum plate. The aluminum plate was overall exposed to an ultraviolet light to harden the remaining unexposed portion. The obtained printing plate was set to a Heidelberg GTO printing machine to make a run of printing, whereby more than 100,000 good print copies were obtained.

An aluminum plate of 0.3 mm in thickness was subjected to electrolytic etching treatment in an aqueous 1% nitric acid solution with a quantity of anode electricity of 100 coulomb/dm² per hour. When the etched surface roughness was measured, the aluminum plate had a surface roughness Ra of 0.3 μm. Next, the aluminum plate was immersed for 2 minutes in an aqueous 30% sulfuric acid solution at 55° C. for smut treatment, and then anodized in an aqueous 20% sulfuric acid solution at a current density of 2.5A/dm² so as to have an anodized coat weight of 30 mg/dm². The obtained aluminum support was immersed for 10 seconds in an aqueous 0.001% carboxymethyl cellulose solution at 90° C., washed, and then dried.

Example 2 (Item 2)

On a subbed polyethylene terephthalate film of 25 μm in thickness was coated the following light-sensitive composition so as to have a dry thickness of 2 μm.

Superclon CPE907LTA (chlorinated polyolefin, produced by Sanyo Kokusaku Pulp) 50 parts
TMPTA (trimethylolpropane triacrylate, produced by Shin-Nakamura Kagaku K.K.) 100 parts
Ethyl-p-aminobenzoate 3 parts
DETX (diethylthioxanthone, produced by Ciba Geigy) 3 parts
Carnauba wax 33 parts
Methylethyl ketone 1000 parts Further, on the above composition was laminated polypropylene film of 6 μm in thickness as a cover sheet.

A light-permeable positive image original as brought into contact with the support side of the light-sensitive material, and the light-sensitive material was exposed through the original to a ultraviolet light. Next, the cover sheet was peeled off, and the rest was laminated at 100° C. under a pressure of 1 kg/cm² upon an aluminum plate that was subjected to nitric acid/electrolytic etching treatment under the following conditions. The exposed poriton was peeled off together with the film, and the unexposed portion was transferred onto the aluminum plate. The aluminum plate was overall exposed to a ultraviolet light to harden the remaining unexposed portion. The thus obtained printing plate was set to a Heidelberg GTO printing machine to make a run of printing, whereby more than 100,000 good print copies were obtained.

Electrolytic etching conditions

An aluminum plate of 0.3 mm in thickness was subjected to electrolytic etching treatment in an aqueous 1% nitric acid solution with a quantity of anode electricity of 100 coulomb/dm² per hour. When the etched surface roughness was measured, the aluminum plade had a surface roughness Ra of 0.3 μm. Next, the aluminum plate was immersed for 2 minutes in an aqueous 30% sulfuric acid solution at 55° C. for desmut treatment, and then anodized in an aqueous 20% sulfuric acid solution at a current density of 2.5 A/dm² so as to have an anodized coat weight of 30 mg/dm². The obtained aluminum plate was immersed for 10 seconds in an aqueous 0.01% carboxymethyl cellulose solution at 90° C., washed, and then dried.

Example 3 (Item 3)

On a subbed polyethylene terephthalate film of 25 μm in thickness was coated the following light-sensitive composition so as to have a dry thicknee of 2 μm.
Superclon CPE907LTA (chlorinated polyolefin, Produced by Sanyo Kokuksaku Pulp) 50 parts
TMPTA (trimethylolpropane triacrylate, produced by Shin-Nakamura Kagaku K.K.) 100 parts
Ethyl-p-aminobenzoate 3 parts
DETX (diethylthioxanthone, produced by Ciba Geigy) 3 parts
Carnauba wax 33 parts
Methylethyl ketone 1000 parts Further, on the above composition was laminated polypropylene film of 6 μm in thickness as a cover sheet.

A light permeable positive original image was brought into contact with the support side of the above light-sensitive material, and the light-sensitive material was exposed through the original to a ultraviolet light, and then the cover sheet was removed, whereby the exposed portion of the light-sensitive layer remained on the support side, and a relief image was formed.

Subsequently, an aluminum plate that was subjected to nitric acid/electrolytic etching treatment under the following conditions was laminated with the above light-sensitive layer at 100° C. under a pressure of 1 kg/cm². The exposed portion was peeled off together with the film, and the remaining unexposed portion was transferred onto the aluminum plate. The aluminum plate was overall exposed to a ultraviolet light to harden the remaining unexposed portion. The thus obtained printing plate was set to a Heidelberg GTO printing machine to make a run of printing, whereby more than 100,000 good print copies were obtained.

Electrolytic etching conditions

An aluminum plate of 0.3 mm in thickness was subjected to electrolytic etching treatment in an aqueous 1% nitric acid solution with a quantity of anode electricity of 100 coulomb/dm² per hour. When the etch surface roughness was measured, the aluminum plate had a surface roughness Ra of 0.3 μm. The aluminum plate was then immersed for two minutes in an aqueous 30% sulfuric acid solution at 55° C. for smut treatment, and then anodized in an aqueous 20% sulfuric acid solution at a current density of 2.5 A/dm² so as to have an anodized coat weight of 30 mg/dm². The obtained aluminum support was immersed for 10 seconds in an aqueous 0.01% carboxymethyl cellulose solution at 90° C. washed, and then dried.

Example 4 (Item 4)

On a subbed polyethylene terephthalate film of 25 μm in thickness was coated the following light-sensitive composition so as to have a dry thickness of 2 μm.
Superclon CPE907LTA (chlorinated polyolefin, produced by Sanyo Kokusaku Pulp) 50 parts
TMPTA (trimethylolpropane triacrylate, produced by Shin-Nakamura Kagaku K.K.) 100 parts
Ethyl-p-aminobenzoate 3 parts
DETX (diethylenethioxanthon, produced by Ciba Geigy) 3 parts
Carnauba wax 33 parts
Methylethyl ketone 1000 parts The above composition was laminated upon an aluminum plate that was subjected to nitric acid/electrolytic etching treatment under the following conditions. A light-permeable positive original was brought into close contact with the polyethylene terephthalate film side of the aluminum plate, and the aluminum plate was exposed through the original to a ultraviolet light. The aluminum plate was then let pass between a pair of juxtaposed rollers heated to 80° C. and having a pressure of 3 kg/cm², and the polyethylene terephthalate film was peeled off together with the exposed portion from the aluminum plate, and the exposed portion remained on the aluminum plate. The aluminum plate was overall exposed to a ultraviolet light to harden the remaining unexposed portion. The thus obtained printing plate was set to a Heidelberg GTO printing machine to make a run of printing, whereby more than 100,000 good print copies were obtained.

Electrolytic etching conditions

An aluminum plate of 0.3 mm in thickness was grained by using a stainless wire brush. The grained aluminum plate, after being washed, was immersed for 10 seconds in an aqueous 10% sodium hydroxide solution at 30° C. for surface etching.

The aluminum plate was then subjected to electrolytic etching treatment in an aqueous 1% nitric acid solution bath with a quantity of anode electricity of 80 coulomb/dm2 per hour. When the surface roughness was measured, the aluminum plate had a surface roughness Ra of 0.3 μm.

Next, the aluminum plate was immersed for 2 minutes in an aqueous 30% sulfuric acid solution at 55° C. for desmut treatment, and then anodized in an aqueous 20% sulfuric acid solution at a current density of 2.5 A/dm² so as to have an anodized coat weight of 30 mg/dm². The obtained aluminum support was immersed for 10 seconds in an aqueous 0.01% carboxymethyl cellulose solution at 90° C., washed, and then dried.

Example 5 (Item 5)

On a subbed polyethylene terephthalate film of 25 μm in thickness was coated the following light-sensitive composition so as to have a dry thickness of 2 μm.
Superclon CPE907LTA (chlorinated polyolefin, produced by Sanyo Kokusaku Pulp) 50 parts
TMPTA (trimethylolpropane triacrylate, produced by Shin-Nakamura Kagaku K.K.) 100 parts
Ethyl-p-aminobenzoate 3 parts
DETX (diethylthioxanthone, produced by Ciba Geigy) 3 parts
Carnauba was 33 parts
Methylethyl ketone 1000 parts Further, on the above composition was laminated polypropylene film of 6 μm in thickness as a cover sheet.

A transparent positive image original was brought into close contact with the support side of the light-sensitive material, and the light-sensitive material was exposed through the original to a ultraviolet light. Then the cover sheet was removed, and the rest was laminated at a temperature of 100° C. under pressure of 1 1 kg/cm$^2$ upon an aluminum plate that was subjected to nitric acid/electrolytic etching treatment under the following conditions. The exposed portion was peeled off together with the film, while the unexposed portion was transferred onto the aluminum plate. The aluminum plate was overall exposed to a ultraviolet light to thereby harden the remaining unexposed portion. The thus obtained printing plate was set to a Heidelberg GTO printing machine to make a run of printing, whereby more than 100,000 good print copies were obtained.

An aluminum plate of 0.3 mm in thickness was grained by using a stainless wire brush, washed, and then immersed for 10 seconds in an aqueous 10% sodium hydroxide solution at for surface watching.

Next, the grained aluminum plate was subjected to electrolytic etching treatment in an aqueous 1% nitric acid solution with a quantity of anode electricity of 80 coulomb/dm2 per hour. When the etched surface roughness was measured, the aluminum plate had a surface roughness Ra of 0.3 μm.

The aluminum plate was then immersed in an aqueous sulfuric acid solution for 2 minute-desmut treatment at 55° C., and subjected to anodizing treatment in an aqueous 20% sulfuric acid solution at a current density of 2.5 A/dm$^2$ so as to have an anodized coat weight of 30 mg/dm$^2$. The obtained aluminum support was immersed for 10 seconds in an aqueous 0.01% carboxymethyl cellulose solution at 90° C., washed, and then dried.

Example 6 (Item 6)

On a subbed polyethylene terephthalate film of 25 μm in thickness was coated the following light-sensitive composition so as to have a dry thickness of 2 μm.
Superclon CPE907LTA (chlorinated polyolefin, produced by Sanyo Kokusaku Pulp) 50 parts
TMPTA (trimethylolpropane triacrylate, produced by Shin-Nakamura Kagaku K.K.) 100 parts
Ethyl-p-aminobenzoate 3 parts
DETX (diethylenethioxanthone, produced by Ciba Geigy) 3 parts
Carnauba wax 33 parts
Methylethyl ketone 1000 parts Further, on the above composition was laminated polypropylene film of 6 μm in thickness as a cover sheet.

A light-permeable original image was brought into contact with the support side of the light-sensitive material, and the light-sensitive material was exposed through the original to a ultraviolet light. After that, the cover sheet was removed, and the rest of the light-sensitive material was laminated under pressure of 1 kg/cm$^2$ upon an aluminum plate that was subjected to nitric acid/electrolytic etching treatment under the following conditions. The aluminum plate was overall exposed to a ultraviolet light to harden the remaining unexposed portion. The printing plate thus obtained was set to a Heidelberg GTO printing machine to make a run of printing, whereby more than 100,000 good print copies were obtained.

Electrolytic etching conditions

An aluminum plate of 0.3 mm in thickness was grained by using a stainless wire brush. The grained aluminum plate, after being washed, was immersed for 10 seconds in an aqueous 10% sodium hydroxide solution at 30°0C. for surface etching.

Next, the aluminum plate was subjected to electrolytic etching treatment in an aqueous 1% nitric acid solution with a quantity of anode electricity of 80 coulomb/dm$^2$ per hour. When the surface roughness was measured, the aluminum plate had a surface roughness Ra of 0.3 μm.

Subsequently, the aluminum plate was immersed for two minutes in an aqueous 30% sulfuric acid solution at 55° C. for desmut treatment, and then anodized in an aqueous 20% sulfuric acid solution at a current density of 2.5 A/dm$^2$ so as to have an anodized coat weight of 30 mg/dm$^2$. The obtained aluminum support was immersed for 10 seconds in an aqueous 0.01% carboxymethyl cellulose solution at 90° C., washed, and then dried.

Example 7 (Item 7)

On a subbed polyethylene terephthalate film of 10 μm in thickness was coated the following light-sensitive composition so as to have a dry thickness of 2 μm.
Superclon CPE907LTA (chlorinated polyolefin, produced by Sanyo Kokusaku Pulp) 50 parts
TMPTA (trimethylolpropane triacrylate, produced by Shin-Nakamura Kagaku K.K.) 100 parts
Ethyl-p-aminobenzoate 3 parts
DETX (diethylthioxanthone, produced by Ciba Geigy) 3 parts
Carnauba wax 33 parts
Methylethyl ketone 1000 parts An aluminum plate that was grained/etched under the following conditions was laminated with the above composition under a pressure of 1 kg/m$^2$. A light-permeable original image was brought into contact with the polyethylene terephthalate film side of the aluminum plate, and the aluminum plate was exposed through the original image to a ultraviolet light. The aluminum plate was then let pass between a pair of juxtaposed rollers heated to 80° C. and having a pressure of 3 kg/cm$^2$. When the polyethylene terephthalate film was peeled from the aluminum plate, the unexposed portion remained on the aluminum plate. The aluminum plate was overall exposed to a ultraviolet light to harden the remaining unexposed portion. The obtained printing plate was set to a Heidelberg GTO printing machine to make a run of printing, whereby more than 100,000 good print copies were obtained.

Graining/etching conditions

An aluminum plate of 0.3 mm in thickness was grained by using a stainless wire brush, washed, and then immersed for seconds in an aqueous 10% sodium hydroxide solution at 30° C. for surface etching.

The above aluminum plate was then subjected to electrolytic etching treatment in an aqueous 1% nitric acid solution with a quantity of anode electricity of 80 coulomb/dm² per hour. When the surface roughness was measured, the aluminum plate had a surface roughness Ra of 0.3 μm.

Subsequently, the aluminum plate was immersed for two minutes in an aqueous 30% sulfuric acid solution at 55° C. for desmut treatment, and thereafter anodized in an aqueous 20% phosphoric acid solution at a current density of 2.5 A/dm² so as to have an anodized coat weight of 20 mg/dm². The obtained aluminum support was immersed for 10 seconds in an aqueous 0.01% carboxymethyl cellulose solution at 90° C., washed, and then dried.

Example 8 (Item 8)

On a subbed polyethylene terephthalate film of 10 μm in thickness was coated the following light-sensitive composition so as to have a dry thickness of 2 μm.
Superclon CPE907LTA (chlorinated polyolefin, produced by Sanyo Kokusaku Pulp) 100 parts
TMPTA (trimethylolpropane triacrylate, produced by Shin-Nakamura Kagaku K.K.) 100 parts
Ethyl-p-aminobanzoate 3 parts
DETX (diethylenethioxanthone, produced by Ciba Geigy) 3 parts
Carnauba wax 33 parts
Methylethyl ketone 1000 parts Further, on the above composition was laminated polypropylene film of 6 μm in thickness as a cover sheet.

A transparent original positive image was brought into contact with the support side of the light-sensitive material, and the light-sensitive material was exposed through the original to a ultraviolet light. After that, the cover sheet was peeled off, and the rest was laminated under a pressure of 1 kg/cm² at 100° C. upon an aluminum plate that was subjected to nitric acid/electrolytic etching treatment under the following conditions. The exposed portion was peeled off together with the film, while the unexposed portion was transferred onto the aluminum plate. The aluminum plate was overall exposed to a ultraviolet light to harden the remaining unexposed portion. The thus obtained printing plate was set to a Heidelberg GTO printing machine to make a run of printing, whereby more than 100,000 good print copies were obtained.

Etching conditions

An aluminum plate of 0.3 mm in thickness was subjected to electrolytic etching treatment in an aqueous 1% nitric acid solution with a quantity of anode electricity of 100 coulomb/dm² per hour. When the surface roughness was measured, the aluminum plate had a surface roughness Ra of 0.3 μm. Further, the aluminum plate was immersed for 2 minutes in an aqueous 30% sulfuric acid solution at 55° C. for desmut treatment, and then anodized in an aqueous 20% phosphoric acid solution at a current density of 2.5 A/dm² so as to have an anodized coat weight of 20 mg/dm². The obtained aluminum support was immersed for 10 seconds in an aqueous 0.01% carboxymethyl cellulose solution at 90° C., washed, and then dried.

Example 9 (Item 9)

On a subbed polyethylene terephthalate film of 10 μm in thickness was coated the following light-sensitive composition so as to have a dry thickness of 2 μm.
Superclon CPE907LTA (chlorinated polyolefin, produced by Sanyo Kokusaku Pulp) 50 parts
TMPTA (trimethylolpropane triacrylate, produced by Shin-Nakamura Kagaku K.K.) 100 parts
Ethyl-p-aminobenzoate 3 parts
DETX (diethylthioxanthone, produced by Ciba Geigy) 3 parts
Carnauba wax 33 parts
Methylethyl ketone 1000 parts Further, on the above composition was laminated polypropylene film of 6 μm in thickness as a cover sheet.

A light-permeable positive image original was brought into contact with the support side of the light-sensitive material, and the light-sensitive material was exposed through the original to a ultraviolet light. Then, the cover sheet was removed, and the rest was laminated under a pressure of 1 kg/cm² at 100° C. upon an aluminum plate that was subjected to nitric acid/electrolytic etching treatment under the following conditions. The exposed portion was peeled off together with the film, while the unexposed portion was transferred onto the aluminum plate. The aluminum plate was overall exposed to a ultraviolet light to harden the remaining unexposed portion. The thus obtained printing plate was set to a Heidelberg GTO printing machine to make a run of printing, whereby more than 100,000 good print copies were obtained.

An aluminum plate of 0.3 mm in thickness was subjected to electrolytic etching treatment in an aqueous 1% nitric acid solution with a quantity of anode electricity of 100 coulomb/dm² per hour. When the surface roughness was measured, the aluminum plate had a surface roughness Ra of 0.3 μm. Further, the aluminum plate was immersed for two minutes in an aqueous 30% sulfuric acid solution at 55° C. for desmut treatment, and then anodized in an aqueous 20% phosphoric acid solution at a current density of 2.5 A/dm² so as to have an anodized coat weight of 20 mmg/dm². The obtained aluminum support was immersed for 10 seconds in an aqueous 0.01% carboxymethyl cellulose solution at 90° C., washed, and then dried.

Example 10

On a subbed polyethylene terephthalate film of 10 μm in thickness was coated the following light-sensitive composition so as to have a dry thickness of 2 μm.
Superclon CPE907LTA (chlorinated polyolefin, produced by Sanyo Kokusaku Pulp) 50 parts
TMPTA (trimethylolpropane triacrylate, produced by Shin-Nakamura Kagaku K.K.) 100 parts
3-(2'-Benzimidazoyl)-7-dimethylaminocoumarin 5 parts
3,3',4,4'-Tetra(t-butylperoxycarbonyl)benzophenone 5 parts
Methyl cellosolve 1000 parts An aluminum plate that was subjected to electrolytic etching treatment in a nitric acid solution under the following conditions was laminated with the above composition under a pressure of 3 kg/m². The aluminum plate was then exposed to an argon laser light of 488 nm located on the polyethylene terephthalate film side. The exposed aluminum plated was let pass between a pair of juxtaposed rollers having a pressure of 3 kg/m². The polyethylene terephthalate film was removed together with the exposed portion from the aluminum plate, and the unexposed portion remained on the aluminum plate. The aluminum plate was overall exposed to a ultraviolet light to harden the remaining unexposed portion. The thus obtained printing plate was set to a Heidelberg GTO printing machine to make a run of printing, whereby more than 100,000 print copies were obtained.

Electrolytic etching conditions

An aluminum plate of 0.3 mm in thickness was subjected to electrolytic etching treatment in an aqueous 1% nitric acid solution with a quantity of anode electricity of 100 coulomb/dm$^2$ per hour. When the surface roughness was measured, the aluminum plate had a surface roughness Ra of 0.3 μm. Next, the aluminum plate was immersed for two minutes in an aqueous 30% sulfuric acid solution at 55° C. for desmut treatment, and then anodized in an aqueous 20% phosphoric acid solution at a current density of 2.5 A/dm$^2$ so as to have an anodized coat weight of 20 mg/dm$^2$. The obtained aluminum support was immersed for 10 seconds in an aqueous 0.01% polyvinylsulfonic acid solution at 90° C., washed, and then dried.

Example 11

Butyl acrylate-ethyl acrylate-maleic anhydride copolymer 80 parts
Superclon CPE907LTA (chlorinated polyolefin, produced by Sanyo Kokusaku Pulp) 20 parts
Dipentaerythritol hexaacrylate 60 parts
Pentaerythritol/terephthalic acid/acrylate (2:1:7) 60 parts
Cationic dye-borate complex (Compound IR-1) 1 part
Tetrabutylammoniumbutyltriphenyl borate 3 parts
Methyl cellosolve 1000 parts The above composition was laminated under a pressure of 3 kg/m$^2$ upon an aluminum plate that was subjected to nitric acid/electrolytic etching treatment under the following conditions. Next, the laminated aluminum plate was exposed to a 830 nm semiconductor laser light that was located on the polyethylene terephthalate film side. The exposed aluminum plate was let pass between a pair of juxtaposed pressure rollers heated to 80° C. and having a pressure of 3 kg/m$^2$. The polyethylene terephthalate film was peeled off together with the exposed portion, and the unexposed portion remained on the aluminum plate. The aluminum plate was overall exposed to a ultraviolet light to harden the remaining unexposed portion. The thus obtained printing plate was set to a Heidelberg GTO printing machine to make a run of printing, whereby more than 100,000 good print copies were obtained.

Electrolytic etching conditions

An aluminum plate of 0.3 mm in thickness was subjected to electrolytic etching treatment in an aqueous 1% nitric acid solution with a quantity of anode electricity of 100 coulomb/dm$^2$ per hour. When the surface roughness was measured, the aluminum plate had a surface roughness Ra of 0.3 μm. Next, the aluminum plate was immersed for two minutes in an aqueous sulfuric acid solution at 55° C. for desmut treatment, and then anodized in an aqueous 20% phosphoric acid solution at a current density of 2.5 A/dm$^2$ so as to have an anodized coat weight of 20 mg/dm$^2$. The obtained aluminum supprot was immersed for 10 seconds in an aqueous 0.01% carboxymethyl cellulose solution at 90° C., washed, and then dried.

Example 12

The light-sensitive layer of Example 1 was used to form an image in the same manner as in Example 1 on an aluminum support that was prepared under the following conditions.

An aluminum plate of 0.3 mm in thickness was subjected to electrolytic etching treatment in an aqueous 1% nitric acid solution. When the surface roughness was measured, the aluminum plate had a surface roughness Ra of 0.3 μm. Next, the aluminum plate was immersed for two minutes in an aqueous 30% sulfuric acid solution at 55° C. for desmut treatment, and then anodized in an aqueous 20% sulfuric acid solution at a current density of 2.5 A/dm$^2$ so as to have an anodized coat weight of 25 mg/dm$^2$. The obtained aluminum support was immersed for 10 seconds in an aqueous 0.01% carboxymethyl cellulose solution at 90° C., washed, and then dried.

Example 13

The light-sensitive layer of Example 1 was used to form an image in the same manner as in Example 1 on an aluminum support that was prepared under the following conditions.

An aluminum plate of 0.3 mm in thickness was grained by using a stainless wire brush, and then immersed for 10 seconds in an aqueous 10% sodium hydroxide solution for surface etching treatment. Subsequently, the aluminum plate was subjected to electrolytic etching treatment in an aqueous 1% nitric acid solution with a quantity of anode electricity of 80 coulomb/dm$^2$ per hour. When the treated surface roughness was measured, the aluminum plate had a surface roughness Ra of 0.4 μm.

The light-sensitive layer of Example 1 was used to form an image in the same manner as in Example 1 on an aluminum support that was prepared under the following conditions.

An aluminum plate of 0.3 mm in thickness was subjected to electrolytic etching treatment in an aqueous 1% nitric acid solution. When the treated surface roughness was measured, the aluminum plate had a surface roughness Ra of 0.3 μm. Next, the aluminum plate was immersed for two minutes in an aqueous 30% sulfuric acid solution at 55° C. for desmut treatment, and then anodized in an aqueous 20% phosphoric acid solution at a current density of 2.5 A/dm$^2$ so as to have an anodized coat weight of 25 mg/dm$^2$. The obtained aluminum support was immersed for 10 seconds in an aqueous 0.01% carboxymethyl cellulose solution at 90° C., washed, and then dried.

Example 15

The light-sensitive layer of Example 1 was used to form an image in the same manner as in Example 1 on an aluminum support that was prepared under the following conditions.

An aluminum plate of 0.3 mm in thickness was grained by using a stainless wire brush, and then immersed for 10 seconds in an aqueous 10% sodium hydroxide solution at 30° C. for surface etchin treatment. Next, the aluminum plate was subjected to electrolytic etching treatment in an aqueous 1% nitric acid solution with a quantity of anode electricity of 80 coulomb/dm$^2$ per hour. When the etched surface roughness was measured, the aluminum plate had a surface roughness Ra of 0.4 μm.

Comparative Example 1

The light-sensitive layer of Example 1 was used to form an image in the same manner as in Example 1 on an aluminum support that was prepared under the following conditions.

An aluminu plate of 0.3 mm in thickness was subjected to electrolytic etching treatment in an aqueous 1% nitric acid solution. When the etched surface roughness was measured, the aluminum plate had a surface roughness Ra of 0.4 μm. After that, the aluminum plate was immersed for two minutes in an aqueous 30% sulfuric acid solution at 55° C. for desmut treatment, and then anodized in an aqueous 20% sulfuric acid solution at a current density of 2.5 A/dm² so as to have an anodized coat weight of 25 mg/dm². The obtained aluminum support was immersed for 10 seconds in an aqueous 0.01% polyvinylsulfonic acid solution at 90° C., washed, and then dried.

Comparative Example 2

The light-sensitive layer of Example 1 was used to form an image in the same manner as in Example 1 on an aluminum support that was prepared under the following conditions.

An aluminum plate of 0.3 mm in thickness was grained by using a stainless wire brush, and then immersed for 10 seconds in an aqueous 10% sodium hydroxide solution at 30° C. for surface etching treatment. When the treated surface roughness was measured, the aluminum plate had a surface roughness Ra of 0.4 μm.

Comparative Example 3

The light-sensitive layer of Example 1 was used to form an image in the same manner as in Example 1 on an aluminum support that was prepared under the following conditions.

An aluminum plate of 0.3 mm in thickness was subjected to electrolytic etching treatment in an aqueous 1% nitric acid solution. When the etched surface roughness was measured, the aluminum plate had a surface roughness Ra of 0.8 μm. After that, the aluminum plate was immersed for two minutes in an aqueous 30% sulfuric acid solution at 55° C. for desmut treatment, and then anodized in an aqueous 20% phosphoric acid solution at a current density of 2.5 A/dm² so as to have an anodized coat weight of 25 mg/dm². The obtained aluminum support was immersed for 10 seconds in an aqueous 0.01% carboxymethyl cellulose solution at 90° C., washed, and then dried.

Comparative Example 4

The light-sensitive layer of Example 1 was used to form an image in the same manner as in Example 1 on an aluminum support that was prepared under the following conditions.

An aluminum plate of 0.3 mm in thickness was subjected to electrolytic etching treatment in an aqueous 1% nitric acid solution. When the etched surface roughness was measured, the aluminum plate had a surface roughness Ra of 0.4 μm. Next, the aluminum plate was immersed for two minutes in an aqueous sulfuric acid solution at 55° C. for desmut treatment, and then anodized in an aqueous 20% phosphoric acid solution at a current density of 2.5 A/dm² so as to have an anodized coat weight of 3 mg/dm². The obtained aluminum support was immersed for 10 seconds in an aqueous 0.01% carboxymethyl cellulose solution at 90° C., washed, and then dried.

The test results of the aluminum supports obtained in the above Examples 12 to 15 and Comparative Examples 1 to 4 are shown below, wherein data of their physical properties are shown in Table 1, and their image formation evaluation results in Table 2.

TABLE 1

| | Surface roughness (μm) | | Peak count | Anodizing | |
|---|---|---|---|---|---|
| | (Ra) | (Rmax) | | Bath condition | AD weight (mg/dm²) |
| Example 12 | 0.3 | 3.2 | 0.1 | Sulfuric acid | 25 |
| Example 13 | 0.4 | 3.8 | 0.4 | Phosphoric acid | 20 |
| Example 14 | 0.4 | 4.2 | 0.3 | Phosphoric acid | 20 |
| Example 15 | 0.4 | 3.8 | 0.4 | Phosphoric acid | 20 |
| Comp. ex. 1 | 0.4 | 4.5 | 0.3 | Sulfuric acid | 25 |
| Comp. ex. 2 | 0.4 | 4.8 | 150 | Sulfuric acid | 25 |
| Comp. ex. 3 | 0.8 | 6.5 | 450 | Sulfuric acid | 25 |
| Comp. ex. 4 | 0.4 | 4.2 | 0.1 | Phosphoric acid | 3 |

TABLE 2

| | Printing durability | Halftone reproducibility | Transfer uniformity | Number of pinholes |
|---|---|---|---|---|
| Example 12 | 150,000 | 2–98% | ±2% | 5 or less |
| Example 13 | 300,000 | 2–98% | ±2% | 5 or less |
| Example 14 | 200,000 | 2–98% | ±2% | 5 or less |
| Example 15 | 200,000 | 2–98% | ±2% | 5 or less |
| Comp. ex. 1 | 70,000 | 2–98% | ±2% | 5 or less |
| Comp. ex. 2 | 150,000 | 5–95% | ±5% | 30 |
| Comp. ex. 3 | 150,000 | 5–95% | ±5% | 100 |
| Comp. ex. 4 | 50,000 | 2–98% | ±2% | 5 or less |

The evaluation criteria in Table 2 are as follows:

Printing durability: In printing on sheets of fine paper by using a Heidelberg printing machine, the number of print copies until when the density drop begins to appear in the solid density area.

Halftone reproducibility: The reproducibility of an image that was formed on the aluminum plate after exposing the aluminum plate through a 175 lines/inch haltone dot original image.

Transfer uniformity: Difference between the mininum density and the maximum density of an image that was formed on the aluminum plate by exposing the aluminum plate through an A2-size 150 lines/inch 50% screen tint film.

Pinholes: The number of pinholes found in 1 mm² visual field by using a 25-power magnifying glass.

As has been mentioned, it is understood that the printing plate obtained according to the method of the invention has a high resolution, is excellent in the printing durability as well as in the image uniformity, and has few pinholes.

What is claimed is:

1. A method of producing a printing plate, the method comprising the steps of:

(a) providing a light-sensitive material on an aluminum support, the light-sensitive material comprising a photo-hardenable light-sensitive layer on a 50 μm or less thick film so that the support faces the light-sensitive layer, the surface on the light-sensitive layer side of the support is electrolytically etched in a nitric acid solution to have an average surface roughness $R_a$ of 0.1 to 0.6 μm, whereby a light-sensitive plate is obtained;

(b) imagewise exposing to light the photo-hardenable photosensitive layer of the light-sensitive plate;

(c) applying heat or pressure to the entire exposed light-sensitive plate;

(d) removing the exposed light-sensitive layer from the light-sensitive plate to leave an unexposed light-sensitive layer on the aluminum support; and (e) overall exposing to light the unexposed light-sensitive layer to harden the same.

2. The method of claim 1, wherein the surface on the light-sensitive layer side of said support is mechanically grained, and then electrolytically etched in a nitric acid solution to have an average surface roughness $R_a$ of 0.1 to 0.6 μm.

3. The method of claim 1, wherein the surface on the light-sensitive layer side of said support is electrolytically etched in a nitric acid solution to have an average surface roughness $R_a$ of 0.1 to 0.6 μm, and then anodized in a phosphoric acid solution to obtain an anodized film weight of 5 to 40 mg/dm$^2$.

4. The method of claim 1, wherein the step of applying heat or pressure is carried out by passing the plate between heat pressure rollers.

* * * * *